United States Patent [19]

Fujimoto et al.

[11] Patent Number: 5,116,663

[45] Date of Patent: May 26, 1992

[54] CERAMIC SUBSTRATE MATERIAL CONTAINING AN AMORPHOUS FLUORINE RESIN

[75] Inventors: Hiroyoshi Fujimoto; Sunao Fukutake; Rie Egashira, all of Okayama, Japan

[73] Assignee: W. L. Gore & Associates, Inc., Newark, Del.

[21] Appl. No.: 621,676

[22] Filed: Dec. 3, 1990

[30] Foreign Application Priority Data

Dec. 4, 1989 [JP] Japan ................................. 1-313441

[51] Int. Cl.⁵ .............................................. B32B 9/00
[52] U.S. Cl. .................................. 428/209; 428/306.6; 428/307.3; 428/311.1; 428/311.5; 428/312.2; 428/312.8; 428/422; 428/901; 361/397
[58] Field of Search .............. 428/306.6, 307.3, 311.1, 428/311.5, 312.2, 312.8, 422, 209, 901; 361/397

[56] References Cited

U.S. PATENT DOCUMENTS

| | | | |
|---|---|---|---|
| 4,754,009 | 6/1988 | Squire | 526/247 |
| 4,783,359 | 11/1988 | Fleischer et al. | 428/209 |
| 4,882,455 | 11/1989 | Sato et al. | 428/209 |

FOREIGN PATENT DOCUMENTS 0332561 9/1989 European Pat. Off.
2143151 2/1985 United Kingdom.

OTHER PUBLICATIONS

"Proceedings of the 37:th Electronic Components Conference", May 11-13, 1987.
Electronics, vol. 59, No. 36, Nov. 1986, New York, U.S., pp. 79-80.
Materials Letters, vol. 8, No. 8, Aug. 1989, Amsterdam, NL.

Primary Examiner—Patrick J. Ryan
Attorney, Agent, or Firm—Gary A. Samuels

[57] ABSTRACT

A ceramic substrate material containing an amorphous fluorine resin.

4 Claims, 1 Drawing Sheet

CERAMIC SUBSTRATE MATERIAL CONTAINING AN AMORPHOUS FLUORINE RESIN

FIELD OF THE INVENTION

This invention concerns a ceramic material that contains an amorphous fluorine resin.

BACKGROUND OF THE INVENTION

Along with the increased speeds and frequencies of computers, communications equipment, and other similar devices in recent years, the wiring boards used in the installation of electronic parts have undergone a lowering of their dielectric constants and an increase in density. As to the former, substrates made of fluorine resins have been used because of their low dielectric constants. As for the latter, ceramic substrates have been used because of the advantages in their manufacturing methods and material characteristic.

Low dielectric constant substrates in which the above-mentioned fluorine resins are utilized are reinforced with glass cloth, polyimides, or other materials with high dimensional stability, and therefore have quite good dimensional stability themselves, but the wiring pattern can only be made so dense. They do not, therefore, allow the wiring density to be increased very much, and as a consequence, there is a limit to how much the wiring spacing can be reduced. On the other hand, materials in circuit boards made from ceramic have a high level of dimensional stability, and the wiring pattern can be made fine, i.e., more dense, so that a higher density can be realized. However, there is a drawback in that because the material itself has high dielectric constant, the transmission speed of the signal is slower. In order to compensate for this disadvantageously high dielectric constant, a porous ceramic is desirable so as to cause the material to contain air, thereby lowering the dielectric constant; but the mechanical strength of porous ceramic is weak, and the substrate cannot be used as it is.

Thereupon, the objective of the present invention is to offer a ceramic substrate which permits high density wiring at a low dielectric constant.

SUMMARY OF THE INVENTION

In order to achieve the above objective, the present invention provides a porous ceramic substrate which is characterized in that it is impregnated and/or coated with an amorphous fluorine plastic resin.

DESCRIPTION OF THE INVENTION

Figure 1:
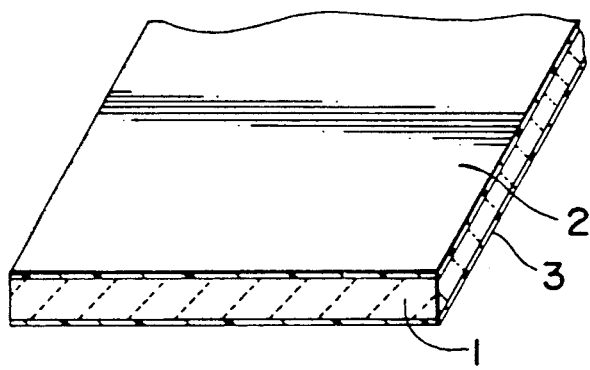
FIG. 1 is a view of a ceramic substrate of the invention described in Example 1.

The ceramic substrate of the present invention comprises not only wiring substrates of boards of simple shapes in which a copper foil pattern can be formed on the surface of the substrate, but also includes multi-layer substrates in which wiring layers and insulation layers are alternately laminated on the substrate, pin grid array substrates in which the wiring is set up on one side of the substrate and pins on the other side, vessel-form substrates, called "normal packages," and all other types of substrates generally useful in the installation of electronic parts.

The ceramic used in the present invention can be made up of any of the various types of ceramic commonly used in ceramic substrates. For instance, examples include alumina, zirconia, aluminum nitride, and other similar compounds. In terms of the dielectric constant, the higher the porosity of the ceramic, the better, but if the porosity is excessively high the mechanical strength will suffer, so the porosity should be between 25 and 75%.

The amorphous fluorine resin used to coat or pack the porous ceramic has a dielectric constant of about 1.9 to 2.6, and is known as a resin having a low dielectric constant. The amorphous fluorine resin is one which is soluble in solvents or dispersible in dispersants. Any known method can be employed for the means of impregnation or coating from solution or dispersion. Furthermore, the impregnation may be carried out at a normal pressure, under pressurization, or under reduced pressure, and may be performed with a solvent substitution method.

The amorphous fluorine resin is used to impregnate or coat the porous ceramic material, but both impregnation and coating may also be performed. While the coating is not limited to any particular thickness, it is generally 100 um or less.

Examples of amorphous fluorine resins include copolymer of tetrafluoroethylene and perfluoro 2,2-di(-loweralkyl)-1,3-dioxoles, such as perfluoro-2,2-dimethyl 1,3-dioxole. The copolymer is available from the DuPont Company as Teflon AF fluorine resin. The copolymer has 60–90% by weight of the dioxole present.

By impregnating or coating a ceramic with an amorphous fluorine resin, because the dielectric constant of the fluorine resin is low, a ceramic substrate can be produced which has a practical level of strength, wherein the weak mechanical strength of the porous ceramic is reinforced without changing its low dielectric constant. And even though it is porous, because it will have dimensional stability and thermal radiation characteristics equivalent to non-porous ceramic substrates, the density of the wiring can be increased and the wiring spacing reduced.

Thermal Shock

Test specimens about 10×40 mm and 1 mm thick were placed in an oven for 30 minutes at 250° C. and then removed and immediately quenched in water at 0° C. The quenched sample was then examined for cracks.

Dimensional Stability

Expansion along the Z axis was determined by measuring the size change at two different temperatures between 25° C. and 250° C.

Dielectric Constant

The dielectric constant was calculated by capacitance measurements.

By using a transformer which can match the inside impedance of the source and the impedance of a bridge (approximately 200 ohm), the sample is connected at the point Cx. The dielectric constant is measured by controlling the condensor Cs used for a measurement and conductance shifter g. in which the capacitance Cx becomes equal to the measured capacitance Cs when the bridge is balanced. The dielectric constant Er is calculated as follows.

$$Er = \frac{Cx}{Co}$$

where Co is the electrostatic capacitance of the vacuum which is calculated by the area of the sample and the thickness of the dielectric.

Apparent Specific Gravity and Porosity

Mechanical Strength

Mechanical strength is determined by the three points flex test, using test pieces 10×40 mm and 1 mm thick.

The test pieces are measured with a 1/100" vernier. The test pieces were placed under load and the maximum load recorded at which the speciments are broken.

Span was 30 mm and cross head speed was 0.5 mm/min.

Calculating

Flexural strength is determined as follows:

$$o = \frac{3PL}{2wt^2}$$

where
o = Flexural strength
P = Maximum load (Kgf)
L = Span (mm)
w = Width of speciment (mm)
t = Thickness of speciment (mm)
Apparent specific gravity is determined by $$d = \frac{W}{wtl}$$

where
d = Apparent specific gravity
W = Weight (g)
w = Width of specifment (cm)
t = Thickness of specifment (cm)
l = Length of speciment (cm)
Porosity is determined by $$P(\%) = \frac{(3.9 - d)}{3.9}$$

where
P = Porosity
d = Apparent specific gravity

EXAMPLES

In the Examples, the porous ceramic sheet used was made by coagulating $Al_2O_3$ and granular polytetrafluoroethylene (PTFE) in an 85%/15% weight relationship, blending with propylene glycol, and compressing at about 3kg/cm² to form a preform. The preform was extruded into a 6 mm rod, rolled down and soaked in water to remove the propylene glycol. After drying, stamping, presintering at 600° C. for two hours to evaporate the PTFE and then sintered at 1650° C. for two hours. The porous ceramic was ready for use.

EXAMPLE 1

FIG. 1 shows a practical example of the ceramic material of the present invention. In the figure, porous ceramic sheet 1 is impregnated with a amorphous fluorine resin, and is coated on both the top and bottom sides 2 and 3 with the fluorine resin. The ceramic sheet 1 is a uniformly porous ceramic sheet with a thickness of 1 mm, and a porosity of 40%. The impregnation was performed with a solvent substitution method at normal pressure using a fluorine resin (Teflon AF 1600, made by DuPont) dissolved in a solvent of Fluorinert (made by 3M) at a concentration of 2%. Impregnation was carried out by dipping into the Teflon AF solution and applying ultrasonic waves to the dipping mixture. Using the same fluorine resin solution, both sides of the impregnated ceramic sheet 1 were then coated so as to form an overall thickness of 10 um.

The porous ceramic substrate thus obtained had a specific dielectric constant of 4.5, a linear coefficient of expansion that was nearly the same as that with the same ceramic alone, and had a mechanical strength that was high enough to withstand practical use. Here, the dielectric constant was determined as the average of the entire substrate by means of JIS C 6481 (transformer bridge method).

EXAMPLE 2

In the same manner as in Example 1, a porous ceramic sheet the same as in Example 1 was impregnated and coated using a solution in which a different fluorine resin (Saitop, made by Asahi Glass) was dissolved to 2% in a solvent (Fluorinert from 3M).

A ceramic substrate was obtained which had the same specific dielectric constant, linear coefficient of expansion, and mechanical strength as those in Practical Example 1.

EXAMPLE 3

A copper clad sheet was produced by bonding with a hot press a copper foil with a thickness of 35 um to a ceramic substrate with a thickness of 0.5 mm which was produced in the same manner as in Example 1, and on this copper clad sheet was formed a wiring pattern. This wiring pattern was then covered over with a fluorine resin sheet with a thickness of 50 um as an insulating sheet, which was bonded and laminated with a hot press. Another sheet of copper foil was bonded to this insulating sheet, and was given a pattern. This process was repeated to arrive at a multi-layer substrate.

The specific dielectric constant, linear coefficient of expansion, and mechanical strength of this multi-layer substrate were all good.

EXAMPLE 4

Figure 2:
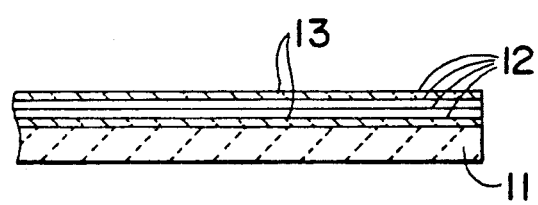
FIG. 2 is a side view of a ceramic substrate with alternating layers of conductor and insulation described in Example 4.

Aluminum was vapor deposited in a thickness of 5 um on a ceramic substrate of this invention with a thickness of 1 mm and produced in the same manner as Example 1 (FIG. 1), and selective etching was performed to form wiring pattern. Over this was formed an insulation layered by spin coating with a solution in which a fluorine resin (Teflon Af, made by DuPont) had been dissolved in the Fluorinert solvent in a concentration of 2%. A multi-layer substrate like that shown in FIG. 2 was completed by repeating this process. In FIG. 2, 11 is the ceramic substrate, 12 is the conductor pattern, and 13 is the insulation layer.

The specific dielectric constant, linear coefficient of expansion, and mechanical strength of this multi-layer substrate were all excellent.

EXAMPLE 5

A fluorine resin was used for impregnation and coating in the same manner as in Example 1, except that here the porous ceramic was one in which pins had been set up on one side, and to this were applied multiple layers in the same manner as in Example 4. After this, large scale integration (LSI) and other electronic parts were installed on the multiple layers.

Figure 3:
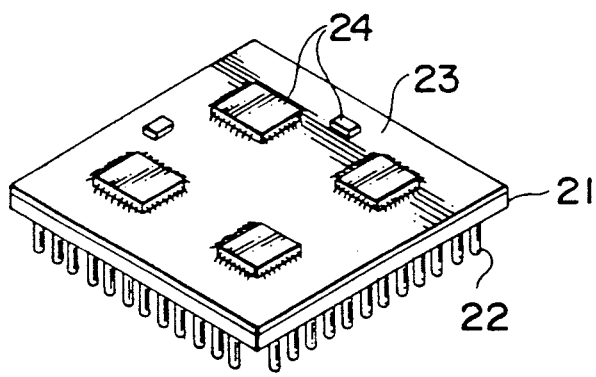
FIG. 3 is a view of a ceramic substrate described in Example 5.

The multi-chip module thus obtained is shown in FIG. 3. In FIG. 3, 21 is the ceramic substarate 22 is the pins, 23 is the wiring pattern, and 24 is the electronic parts.

EXAMPLE 6

Figure 4:
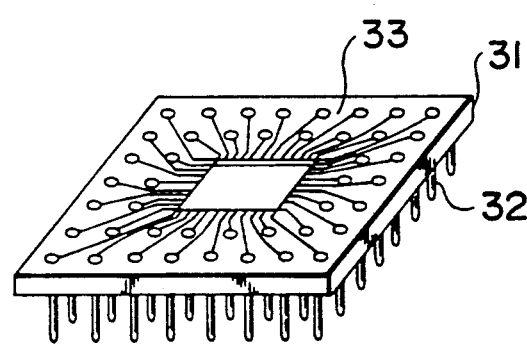
FIG. 4 is view of a ceramic substrate described in Example 6.

After impregnating and coating with a fluorine resin a porous ceramic substrate in which one side had pins set up in the same manner as in Example 5, vapor deposition and etching were used in the same manner as in Example 5 to form a single layer wiring pattern on the side opposite the pins, which resulted in pin grid array substrate like that shown in FIG. 4. In FIG. 4, 31 isa the ceramic substrate, 32 is the pins, and 33 is the wiring pattern.

Properties

With the present invention, a ceramic substrate that is practical in terms of mechanical strength and with the low dielectric constant of the porous ceramic still intact can be obtained by impregnating or coating a porous ceramic with a fluorine resin. Furthermore, because the ceramic substrate of the present invention has dimensional stability, thermal radiation characteristics, and mechanical strength that is equivalent to conventional solid ceramic substrates, and also has a lower dielectric constant than conventional solid ceramic substrates, the use of this substrate allows the wiring density to be increased on a level that is equivalent to conventional solid substrates, and in addition, permits increases in transmission speed due to the low dielectric constant, which in turn makes possible speed increases in electronic parts.

The following Table I provides dielectric constant data on several samples of $Al_2O_3$ ceramic substrate of 43% porosity made as in Example 1 at various Teflon AF 1600 levels of coating or impregnation and coating.

TABLE I

Dielectric Constant of Teflon AF 1600 Impregnated and Coated Ceramic Board

| Sample Name | Porosity of Ceramic Board % Original Porosity | Concentration of Teflon AF (%) Solution Used | Dielectric Constant (1MHz) |
|---|---|---|---|
| 1 Coating | 43 | 1 | 3.97 |
| 2 Coating | 43 | 2 | 4.21 |
| 3 Coating | 43 | 8 | 4.39 |
| 4 Impregnate and Coat | 43 | 1 | 4.63 |
| 5 Impregnate and Coat | 43 | 2 | 4.88 | cf (1) Base material $Al_2O_3$ 99.9%, Er = 0.25
(2) Result by calculation of dielectric constant of 43% porous ceramic board $Er_{43\%}$
$= 9.25^{(1-0.43)} = 3.55$ The increase in dielectric constant shows that the pores are being filled, displacing air.

The following Table II shows that the ceramic substrates of the invention made as in Example 1 have good dimensional stability.

TABLE II

Dimension Stability

| Sample Name | Porosity of Ceramic Board % Original Porosity | Concentration of Teflon AF (%) Solution Used | Thermal Exansion (ppm/C.°) in Vertical Direction |
|---|---|---|---|
| 1 Full Density Ceramic | 0 | — | 6.8 |
| 2 Untreated Porous Ceramic | 43 | — | 6.8 |
| 3 Coating | 43 | 1 | 8.2 |
| 4 Impregnate and Coat | 43 | 1 | 8.9 |

Test condition thermal expansion by TMA (25-250° C.)

The following Table III shows that on rapid quenching from 250° C. to 0° C., the ceramic sheets made as in Example 1 did not crack, thus showing good resistance to thermal shock.

TABLE III

Thermal Shock Test

| Sample Name | Porosity of Ceramic Board % Original Porosity | Concentration of Teflon 1600 AF (%) Insulation | Cracks |
|---|---|---|---|
| Full Density Ceramic | 0 | — | none |
| Untreated Porous Ceramic | 43 | — | none |
| Coat-1 | 43 | 1 | none |
| Coat-2 | 43 | 2 | none |
| Coat-3 | 43 | 8 | none |
| Impregnate and coat-1 | 43 | 1 | none |
| Impregnate and coat-2 | 43 | 2 | none |

Test conditions 250° C 0° C quench
Test specimens about 10 × 40 mm and 1 mm thick were placed in an oven for 30 minutes at 250° C. and then removed and immediately quenched in water at 0° C. The quenched same was then examined for cracks.

We claim:

1. A porous ceramic substrate coated with an amorphous copolymer of tetrafluoroethylene and perfluoro-2,2-(lower alkyl)-1,3-dioxole; said copolymer having a dielectric constant between about 1.9 and 2.6.

2. The coated porous ceramic substrate of claim 1 wherein the ceramic is $Al_2O_3$.

3. The coated porous ceramic substrate of claim 1 wherein the amorphous copolymer also impregnates the pores of the porous ceramic substrate.

4. A conductive wiring board comprising the coated porous ceramic substrate of claim 1 which has conductive wiring adhered to the coating of amorphous copolymer.

* * * * *